(12) United States Patent
Choi

(10) Patent No.: US 12,557,481 B2
(45) Date of Patent: Feb. 17, 2026

(54) DISPLAY DEVICE

(71) Applicant: Samsung Display Co., LTD., Yongin-si (KR)

(72) Inventor: Chul Hyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 320 days.

(21) Appl. No.: 18/217,744

(22) Filed: Jul. 3, 2023

(65) Prior Publication Data
US 2024/0114725 A1   Apr. 4, 2024

(30) Foreign Application Priority Data

Sep. 30, 2022  (KR) .......................... 10-2022-0125734

(51) Int. Cl.
*H10K 59/122* (2023.01)
*H10K 59/80* (2023.01)
*H10K 102/00* (2023.01)

(52) U.S. Cl.
CPC ......... *H10K 59/122* (2023.02); *H10K 59/873* (2023.02); *H10K 59/879* (2023.02); *H10K 2102/351* (2023.02)

(58) Field of Classification Search
CPC ......................................... H10K 59/873–8792
See application file for complete search history.

(56) References Cited

U.S. PATENT DOCUMENTS

| | | | |
|---|---|---|---|
| 7,915,821 B2 | 3/2011 | Kang | |
| 2016/0197308 A1* | 7/2016 | Jeong | H10K 59/879 |
| | | | 257/40 |
| 2021/0305537 A1 | 9/2021 | Song et al. | |
| 2022/0140290 A1* | 5/2022 | Choi | H10K 59/8731 |
| | | | 257/40 |
| 2022/0376208 A1* | 11/2022 | Choi | H10K 50/858 |
| 2024/0414972 A1* | 12/2024 | Hong | H10K 59/35 |

FOREIGN PATENT DOCUMENTS

| | | | |
|---|---|---|---|
| CN | 116469989 A | * 7/2023 | ............. H10H 20/85 |
| KR | 100611768 B1 | 8/2006 | |
| KR | 1020210122344 A | 10/2021 | |
| KR | 1020220005099 A | 1/2022 | |
| KR | 1020220060071 A | 5/2022 | |

* cited by examiner

*Primary Examiner* — Mariceli Santiago
(74) *Attorney, Agent, or Firm* — CANTOR COLBURN LLP

(57) ABSTRACT

A display device includes a base layer, a pixel defining layer, a light emitting element comprising a light emitting layer, and an encapsulation layer disposed on the light emitting element. The encapsulation layer includes a first optical layer, a second optical layer disposed on the first optical layer, a stabilization layer disposed on the second optical layer, and an optical control layer disposed on the stabilization layer. A refractive index of the first optical layer is greater than a refractive index of the second optical layer, and a refractive index of the stabilization layer is greater than each of the refractive index of the second optical layer and a refractive index of the optical control layer. A thickness of the stabilization layer is greater than a thickness of the first optical layer and a thickness of the second optical layer.

20 Claims, 8 Drawing Sheets

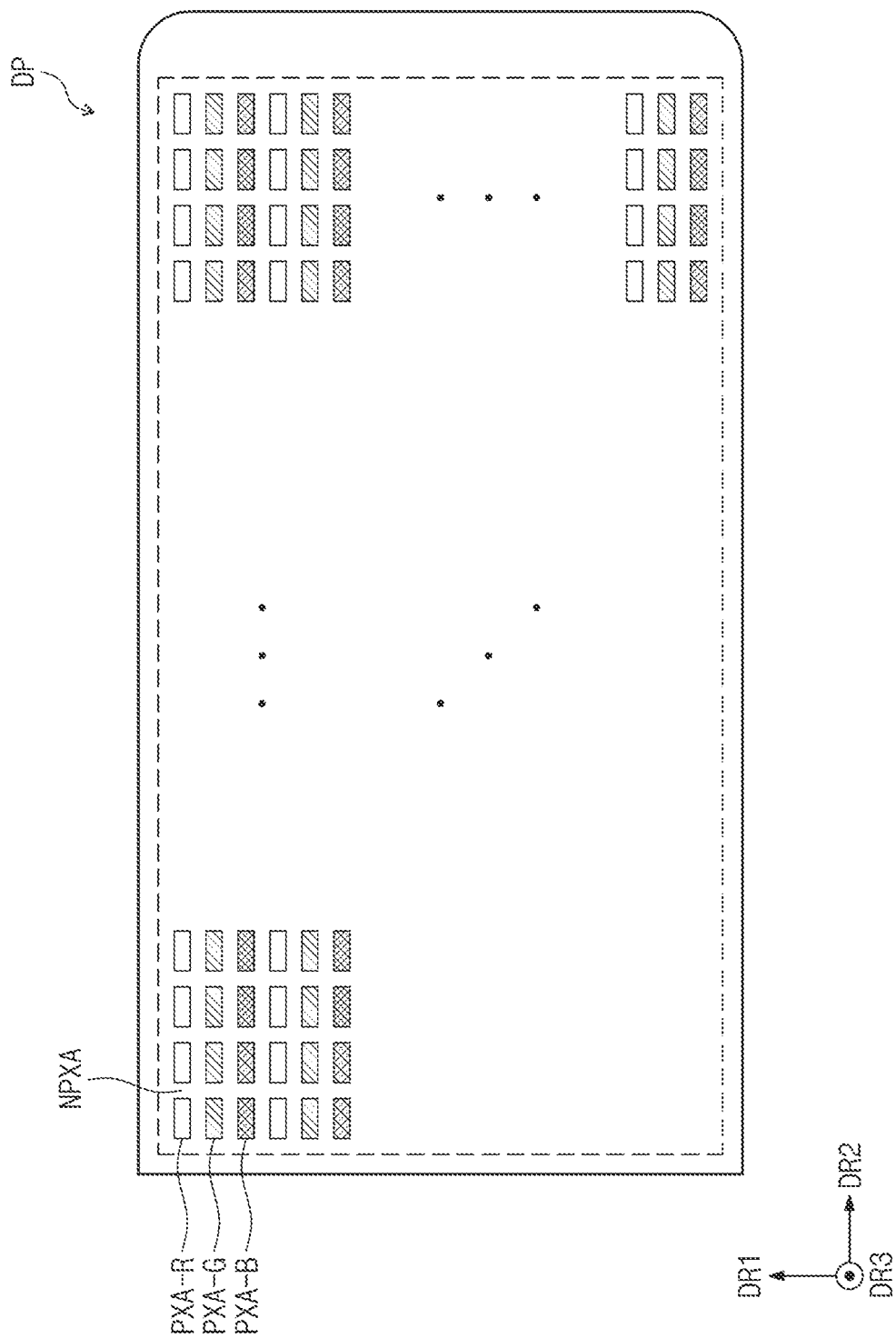

| XPS Composition Ratio | Refractive Index(n) | | | | | | |
|---|---|---|---|---|---|---|---|
| | 1.34 | 1.48 | 1.57 | 1.62 | 1.77 | 1.89 | 1.98 |
| [N/Si] | 0.18 | 0.25 | 0.42 | 0.47 | 0.65 | 0.72 | 0.75 |
| [O/Si] | 1.32 | 1.2 | 0.77 | 0.68 | 0.27 | 0 | 0 |

DISPLAY DEVICE

This application claims priority to Korean Patent Application No. 10-2022-0125734, filed on Sep. 30, 2022, and all the benefits accruing therefrom under 35 U.S.C. § 119, the content of which in its entirety is herein incorporated by reference.

BACKGROUND

1. Field

The disclosure herein relates to a display device, and more particularly, to a display device having improved reliability.

2. Description of the Related Art

A display device may be manufactured with an organic electroluminescent material or a quantum dot light emitting material. Such a light emitting material is typically vulnerable to external environments such as oxygen and moisture and thus such a display device may further include functional layers to protect the light emitting material.

Foreign substances may be introduced into the display device during a process of manufacturing the display device, in which the functional layers are formed, or members of the display device are provided to be bonded to each other, and thus, the light emitting material may be exposed to the external environment by cracks caused by the introduced foreign substances. Thus, various techniques for sealing a light emitting element are desired. Among the techniques, development of an encapsulation technology for encapsulating a light emitting element to block a penetration path of air and moisture, is in progress.

SUMMARY

The disclosure provides a display device having improved reliability.

An embodiment of the invention provides a display device including: a base layer; a pixel defining layer disposed on the base layer, where an opening is defined in the pixel defining layer; a light emitting element including a light emitting layer disposed in the opening; and an encapsulation layer disposed on the light emitting element, where the encapsulation layer includes: a first optical layer; a second optical layer disposed on the first optical layer; a stabilization layer disposed on the second optical layer; and an optical control layer disposed on the stabilization layer, where a refractive index of the first optical layer is greater than a refractive index of the second optical layer, and a refractive index of the stabilization layer is greater than each of the refractive index of the second optical layer and a refractive index of the optical control layer, the stabilization layer includes silicon atoms and nitrogen atoms, and a thickness of the stabilization layer is greater than each of a thickness of the first optical layer and a thickness of the second optical layer.

In an embodiment, the thickness of the stabilization layer may be greater than the sum of the thickness of the first optical layer and the thickness of the second optical layer.

In an embodiment, the thickness of the stabilization layer may be about 7,000 angstroms (Å) or greater and about 9,000 Å or less.

In an embodiment, a ratio of the silicon atoms in the stabilization layer may be about 57% or greater and about 59% or less, and a ratio of the nitrogen atoms in the stabilization layer may be about 41% or greater and about 43% or less.

In an embodiment, the refractive index of the stabilization layer may be about 1.89 or greater and about 1.98 or less.

In an embodiment, each of the thickness of the first optical layer and the thickness of the second optical layer may be about 1,000 Å or greater and about 2,000 Å or less.

In an embodiment, each of the first optical layer and the second optical layer may include at least two selected from silicon atoms, nitrogen atoms, and oxygen atoms.

In an embodiment, the first optical layer may include silicon atoms and nitrogen atoms, a ratio of the silicon atoms in the first optical layer may be about 57% or greater and about 59% or less, and a ratio of the nitrogen atoms in the first optical layer may be about 41% or greater and about 43% or less.

In an embodiment, a ratio of the silicon atoms in the second optical layer may be about 40% or greater and about 41% or less, a ratio of the nitrogen atoms in the second optical layer may be about 7% or greater and about 10% or less, and a ratio of the oxygen atoms in the second optical layer may be about 49% or greater and about 53% or less.

In an embodiment, the refractive index of the first optical layer may be about 1.89 or greater and about 1.98 or less.

In an embodiment, the refractive index of the second optical layer may be about 1.34 or greater and about 1.48 or less.

In an embodiment, the display device may further include: a lower protection layer disposed on the light emitting element; and an upper protection layer disposed on the lower protection layer, wherein each of a refractive index of the lower protection layer and the refractive index of the first optical layer may be greater than a refractive index of the upper protection layer.

In an embodiment, the encapsulation layer may further include a buffer layer disposed between the stabilization layer and the optical control layer, and a refractive index of the buffer layer may be greater than the refractive index of the optical control layer and less than the refractive index of the stabilization layer.

In an embodiment, each of the buffer layer and the optical control layer may include at least two selected from silicon atoms, nitrogen atoms, and oxygen atoms.

In an embodiment, a ratio of the silicon atoms in the buffer layer may be about 46% or greater and about 52% or less, a ratio of the nitrogen atoms in the buffer layer may be about 22% or greater and about 34% or less, and a ratio of the oxygen atoms in the buffer layer may be about 14% or greater and about 32% or less.

In an embodiment, a ratio of the silicon atoms in the optical control layer may be about 41% or greater and about 46% or less, a ratio of the nitrogen atoms in the optical control layer may be about 10% or greater and about 19% or less, and a ratio of the oxygen atoms in the optical control layer may be about 35% or greater and about 49% or less.

In an embodiment, the refractive index of the buffer layer may be about 1.62 or greater and about 1.77 or less.

In an embodiment, the refractive index of the optical control layer may be about 1.48 or greater and about 1.57 or less.

In an embodiment, the display device may further include: a first encapsulation layer; a second encapsulation layer disposed on the first encapsulation layer; and a third encapsulation layer disposed on the second encapsulation layer, wherein the first encapsulation layer may include the encapsulation layer.

In an embodiment, a thickness of the third encapsulation layer may be about 3,000 Å or greater to about 4,000 Å or less.

BRIEF DESCRIPTION OF THE DRAWINGS

The above and other features of the invention will become more apparent by describing in further detail embodiments thereof with reference to the accompanying drawings, in which:

FIG. 3A is a plan view of a display panel according to an embodiment of the invention;

DETAILED DESCRIPTION

Figure 1:
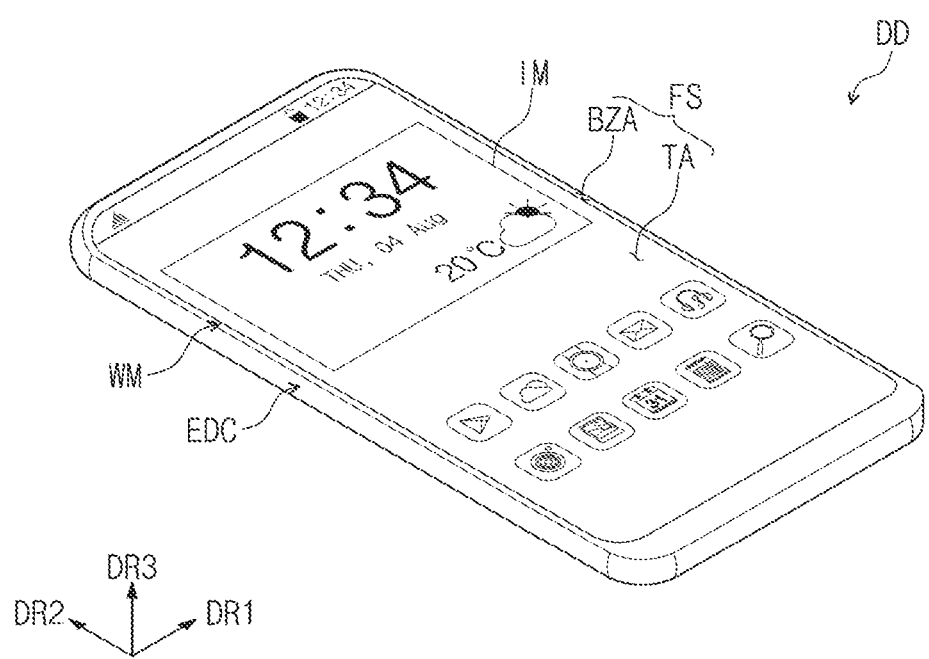
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or area, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that although the terms such as 'first' and 'second' are used herein to describe various elements, these elements should not be limited by these terms. These terms are used only to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by a person of ordinary skill in the art to which the invention belongs. Also, terms such as defined terms in commonly used dictionaries are to be interpreted as having meanings consistent with meaning in the context of the relevant art and are expressly defined herein unless interpreted in an ideal or overly formal sense.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
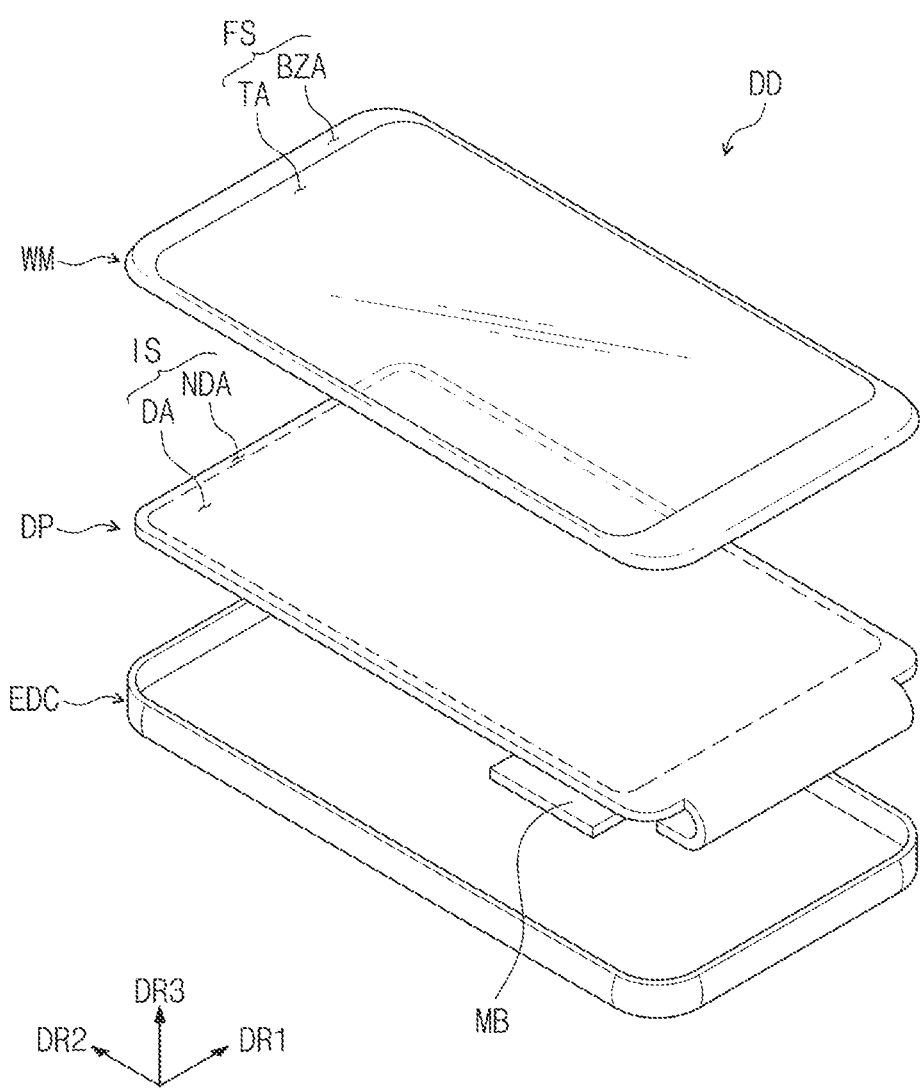
FIG. 2 is an exploded perspective view of the display device according to an embodiment of the invention.

FIG. 1 is a perspective view of a display device according to an embodiment of the invention. FIG. 2 is an exploded perspective view of the display device according to an embodiment of the invention.

The display device DD may be a device that is activated according to an electrical signal to display an image. In an embodiment, for example, the display device DD may be a large-sized device such as televisions, external billboards and the like, or a small or medium-sized device such as monitors, mobile phones, tablet computers, navigation systems, game consoles, and the like, for example, but are not limited thereto unless departing from the concept of the disclosure. In an embodiment, as shown in FIG. 1, the display device DD may be a mobile phone.

Referring to FIG. 1, an embodiment of the display device DD may have a rectangular shape that has short sides extending in a first direction DR1 and long sides extending in a second direction DR2 crossing the first direction DR1 on a plane. However, the embodiment of the invention is not limited thereto, and the display device DD may have various shapes such as a circular shape and a polygonal shape on the plane.

The display device DD according to an embodiment may be flexible. The "flexible" means having a bendable property and may include a structure that is completely folded to few nanometers. In an embodiment, for example, the flexible display device DD may include a curved apparatus or a foldable device. However, the embodiment of the invention is not limited thereto, and the display device DD may have a rigid property.

The display device DD may display an image IM in the third direction DR3 on a display surface parallel to each of the first and second directions DR1 and DR2. The third direction DR3 may be a thickness direction of the display device DD. The image IM provided from the display device DD may include a still image as well as a dynamic image. FIG. 1 illustrates an embodiment where the image IM includes a watch window and icons.

The display surface on which the image IM is displayed may correspond to a front surface of the display device DD and also correspond to a front surface FS of the window CW. Although FIG. 1 illustrates an embodiment where display surface of the display device DD is planar, in an alternative embodiment, a display surface of the display device DD may include a curved surface that is bent from at least one side of the planar surface.

A front surface (or top surface) and a rear surface (or bottom surface) of each of members constituting the display device DD may be opposed to each other in the third direction DR3, and a normal direction of each of the front and rear surfaces may be substantially parallel to the third direction DR3. A spaced distance between the front surface and the rear surface defined along the third direction DR3 may correspond to a thickness of the member (or unit).

Referring to FIGS. 1 and 2, the display device DD may include a window WM, a display panel DP, and a case EDC. The window WM may be coupled to the case EDC to define an outer appearance of the display device DD and may provide an internal space for accommodating components of the display device DD.

The window WM may be disposed on the display panel DP. The window WM may have a shape corresponding to that of the display panel DP. The window WM may cover the entire outer side of the display panel DP and protect the display panel DP from external impacts and scratches.

The window WM may include an optically transparent insulating material. In an embodiment, for example, the window WM may include a glass substrate or a polymer substrate. The window WM may have a single-layered or multi-layered structure. The window WM may further include functional layers such as an anti-fingerprint layer, a phase control layer, and a hard coating layer, which are disposed on the transparent substrate.

The front surface FS of the window WM may include a transmission area TA and a bezel area BZA. The transmission area TA of the window WM may be an optically transparent area. The window WM may transmit the image IM provided by the display panel DP through the transmission area TA, and the user may visually recognize the image IM.

The bezel area BZA of the window WM may be provided as an area on which a material having a predetermined color is printed. The bezel area BZA of the window WM may prevent a component of the display panel DP disposed to overlap the bezel area BZA from being seen from an outside.

The bezel area BZA may be adjacent to the transmission area TA. A shape of the transmission area TA may be substantially defined by the bezel area BZA. In an embodiment, for example, the bezel area BZA may be disposed outside the transmission area TA to surround the transmission area TA. However, this is merely an example, and alternatively, the bezel area BZA may be adjacent to only one side of the transmission area TA or may be omitted. In an embodiment, the bezel area BZA may be disposed on an inner surface of the display device DD rather than the front surface.

The display panel DP may be disposed between the window WM and the case EDC. The display panel DP may display the image IM in response to an electrical signal. The display panel DP according to an embodiment of the invention may be an emission type display panel, but is not limited thereto. In an embodiment, for example, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot, a quantum rod, or the like. Hereinafter, for convenience of description, embodiments where the display panel DP is an organic light emitting display panel will be described in detail.

The image IM provided by the display device DD may be displayed on the front surface IS of the display panel DP. The front surface IS of the display panel DP may include a display area DA and a non-display area NDA. The display area DA may be activated according to an electrical signal to display the image IM. According to an embodiment, the display area DA of the display panel DP may correspond to the transmission area TA of the window WM.

In this specification, that "area/portion and area/portion corresponds to each other" means "overlapping each other", but is not limited to having a same area and/or a same shape as each other.

The non-display area NDA may be adjacent to the outside of the display area DA. In an embodiment, for example, the non-display area NDA may surround the display area DA. However, the embodiment of the invention is not limited thereto, and the non-display area NDA may be defined in various shapes.

The non-display area NDA may be an area on which a driving circuit or driving line for driving elements disposed on the display area DA, various signal lines for providing electrical signals, and pads are disposed. The non-display area NDA of the display panel DP may correspond to the bezel area BZA of the window WM. The components of the display panel DP disposed in the non-display area NDA may be prevented from being visually exposed to the outside by the bezel area BZA.

The display device DD may include a circuit board MB connected to the display panel DP. The circuit board MB may be connected to one end of the display panel DP extending in the first direction DR1. The circuit board MB may generate electrical signals provided to the display panel DP. In an embodiment, for example, the circuit board MB may include a timing controller that generates signals provided to a driver of the display panel DP in response to control signals received from the outside.

In an embodiment of the invention, at least a portion of the non-display area NDA of the display panel DP may be bent.

A portion of the display panel DP to which the circuit board MB is connected may be bent so that the circuit board MB faces a rear surface of the display panel DP. The circuit board MB may be disposed and assembled to overlap the rear surface of the display panel DP on the plane. However, the display panel DP and the circuit board MB are not limited thereto, and the display panel DP and the circuit board MB may be connected through a flexible circuit board connected to ends of the display panel DP and the circuit board MB, respectively.

The case EDC may be disposed below the display panel DP to accommodate the display panel DP. The case EDC may include glass, plastic, or metal material having relatively high rigidity. The case EDC may protect the display panel DP by absorbing an impact applied from the outside or preventing foreign substances/moisture from being penetrated into the display panel DP.

The display device DD according to an embodiment may further include an input sensing layer disposed on the display panel DP to sense an external input applied from the outside. The input sensing layer may sense various types of external inputs such as force, a pressure, a temperature, and light provided from the outside. In an embodiment, for example, the input sensing layer may sense a touch of the user's body or a pen provided from the outside of the display device DD, or an input (e.g., hovering) applied close to the display device DD.

In addition, the display device DD may further include an electronic module including various functional modules for operating the display panel DP and a power supply module supplying necessary power to the display device DD. In an embodiment, for example, the electronic module may include a camera module.

Figure 3B:
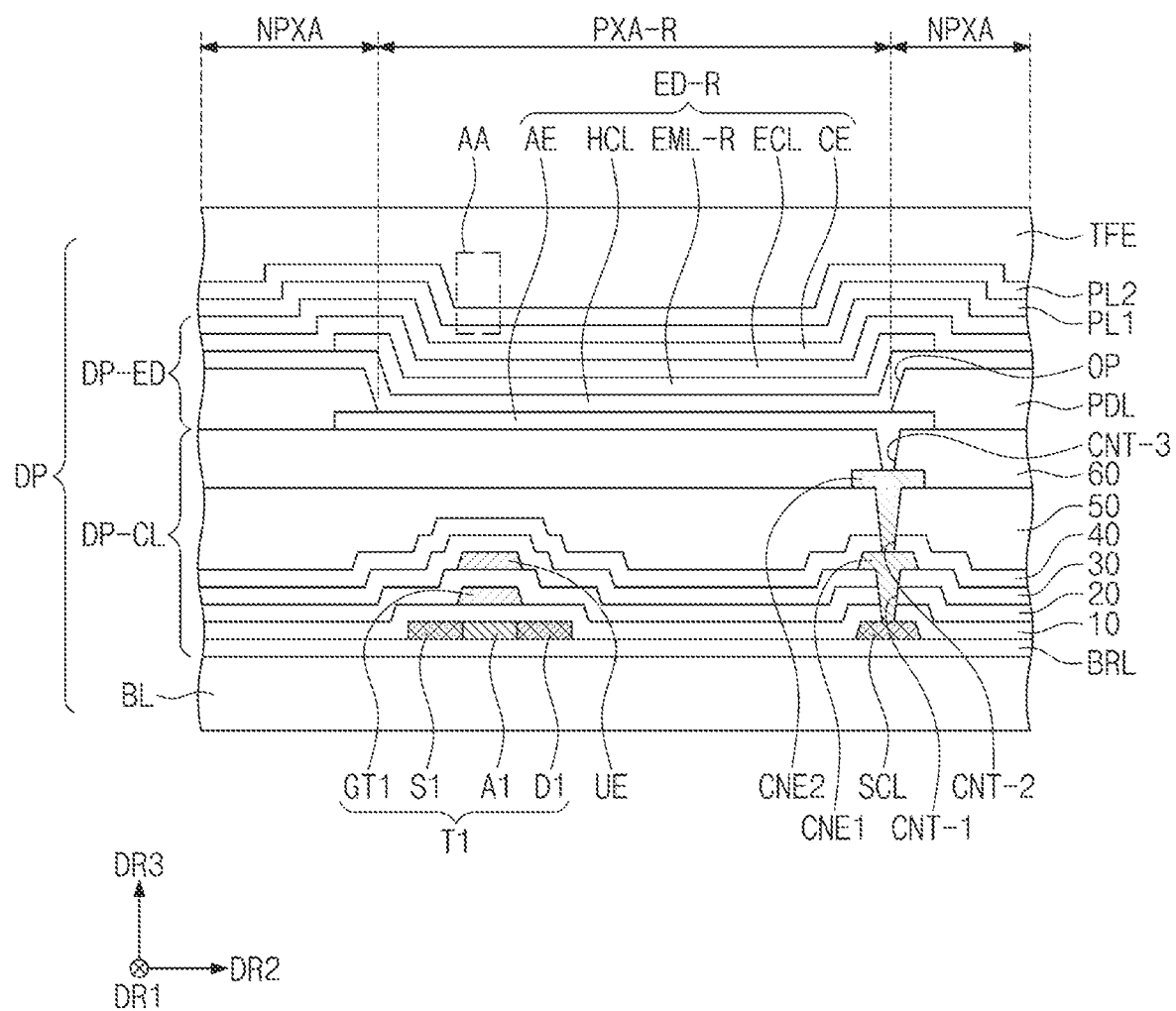
FIG. 3B is a cross-sectional view of the display panel according to an embodiment of the invention.

FIG. 3A is a plan view of the display panel according to an embodiment of the invention. FIG. 3B is a cross-sectional view of the display panel according to an embodiment of the invention. In an embodiment, as illustrated in FIG. 3A, the display panel DP may include a plurality of emission areas PXA-R, PXA-G, and PXA-B. The display panel DP may include a first emission area PXA-R, a second emission area PXA-G, and a third emission area PXA-B, which are distinguished from each other. In an embodiment, the first pixel area PXA-R may be a red emission area that emits red light, the second pixel area PXA-G may be a green emission area that emits green light, and the third pixel area PXA-B may be a blue emission area that emits blue light. The first to third emission areas PXA-R, PXA-G, and PXA-B may be arranged not to overlap each other on a plane defined by the first and second directions DR1 and DR2, and a non-emission area NPXA may be disposed between the adjacent emission areas PXA-R, PXA-G, and PXA-B.

In an embodiment of the display panel DP, as illustrated in FIG. 3A, the emission areas PXA-R, PXA-G, and PXA-B are arranged in a stripe shape. In such an embodiment, in the display panel DP illustrated in FIG. 3A, the plurality of first emission areas PXA-R, the plurality of second emission areas PXA-G, and the plurality of third emission areas PXA-B may be aligned along the second direction DR2. Also, the first emission area PXA-R, the second emission area PXA-G, and the third emission area PXA-B may be alternately arranged along the first direction DR1.

The arrangement form of the emission areas PXA-R, PXA-G, and PXA-B is not limited to that illustrated in FIG. 3A, and an arranged order of the first emission area PXA-R and the second emission area PXA-G, and the third emission areas PXA-B may be provided in various combinations according to characteristics of display quality required for the display panel DP. In an embodiment, for example, the arrangement form of the emission areas PXA-R, PXA-G, and PXA-B may be a PENTILE® arrangement form or a diamond arrangement form. In addition, the arrangement form of the emission areas PXA-R, PXA-G, and PXA-B may be variously adjusted or modified according to surface areas of the emission areas PXA-R, PXA-G, and PXA-B and characteristics of display quality set for the display panel DP on the plane.

A common layer that is commonly provided to overlap the whole of the emission areas PXA-R, PXA-G, and PXA-B having various types of arrangement and the non-emission areas NPXA disposed between the emission areas PXA-R, PXA-G, and PXA-B may be manufactured using a mask.

Referring to FIG. 3B, the display panel DP may include a base layer BL, a circuit layer DP-CL provided on the base layer BL, a display element layer DP-ED, protection layers PL1 and PL2, and an encapsulation layer TFE disposed on the protection layers PL1 and PL2. Although not shown, the display element layer DP-ED may include first, second, and third light emitting elements. A laminated structure of the display panel DP is not particularly limited.

The display panel DP may include a plurality of insulating layers, a semiconductor pattern, a conductive pattern, a signal line, or the like. The insulating layer, the semiconductor layer, and the conductive layer may be formed in a manner such as coating, deposition, or the like. Thereafter, the insulating layer, the semiconductor layer, and the conductive layer may be selectively patterned through photolithography and etching processes. The semiconductor pattern, the conductive pattern, and the signal line, which are provided in the circuit element layer DP-CL and the display element layer DP-ED, may be formed in the above-described manner.

The base layer BL may be a member for providing a reference plane or a base surface on which components provided in the circuit element layer DP-CL are disposed. In an embodiment, the base layer BL may be a glass substrate, a metal substrate, or a polymer substrate. However, the embodiment of the invention is not limited thereto. In an embodiment, for example, the base layer BL may be an inorganic layer, a functional layer, or a composite layer.

The base layer BL may have a multi-layered structure. In an embodiment, for example, the base layer BL may have a three-layered structure constituted by a polymer resin layer, an adhesive layer, and a polymer resin layer. In such an embodiment, the polymer resin layer may include a polyimide-based resin. Also, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, the "~~-based" resin means as including a functional group of "~~".

The circuit element layer DP-CL may be disposed on the base layer BL. FIG. 3B illustrates merely a portion of the semiconductor pattern, and at least one semiconductor pattern may be further disposed on the first emission area PXA-R. The semiconductor patterns may be arranged according to a specific rule. Each of the semiconductor patterns has different electrical properties depending on whether the semiconductor patterns are doped or not. Each of the semiconductor patterns may include a first region having a high doping concentration and a second region having a low doping concentration. The first region may be doped with an N-type dopant or a P-type dopant. A P-type transistor includes the first region doped with the P-type dopant.

The first area may have conductivity greater than that of the second area and may substantially serve as an electrode or a signal line. The second region may substantially correspond to an active (or channel) of the transistor. In such an embodiment, a portion of the semiconductor pattern may be an active of the transistor, another portion may be a source or a drain of the transistor, and further another portion may be a conductive region.

In an embodiment, as illustrated in FIG. 3B, a source S1, a channel A1, and a drain D1 of the transistor T1 are formed from or defined by a semiconductor pattern. FIG. 3B illustrates a portion of a signal transmission area SCL formed from the semiconductor pattern. Although not particularly shown, the signal transmission area SCL may be connected to the drain D1 of the transistor T1 on the plane.

The circuit element layer DP-CL may include a barrier layer BRL disposed on the base layer BL, a first insulating layer 10, a second insulating layer 20, a third insulating layer 30, and a fourth insulating layer 40, a fifth insulating layer 50, and a sixth insulating layer 60. In an embodiment, for example, each of the barrier layer BRL, the first insulating layer 10, and the second insulating layer 20 may be an inorganic layer, and the third insulating layer 30 may be an organic layer.

The barrier layer BRL improves bonding force between the base layer BL and the semiconductor pattern and/or the conductive pattern. The first buffer layer BFL1 may include at least one selected from a silicon oxide layer and a silicon nitride layer. In an embodiment, the silicon oxide layer and the silicon nitride layer may be alternately laminated one on another in the first buffer layer BFL1.

The first insulating layer 10 is disposed on the barrier layer BRL. Each of the first insulating layer 10, the second insulating layer 20, the third insulating layer 30, the fourth insulating layer 40, the fifth insulating layer 50, and the sixth insulating layer 60 may be an inorganic layer or an organic layer. A gate GT1 of the transistor TRI is disposed on the first insulating layer 10. An upper electrode UE may be disposed on the second insulating layer 20. A first connection electrode CNE1 may be disposed on the third insulating layer 30. The first connection electrode CNE1 may be connected to the signal transmission area SCL through a contact hole CNT-1 defined through the first to third insulating layers 10 to 30. A second connection electrode CNE2 may be disposed on the fifth insulating layer 50. The second connection electrode CNE2 may be connected to the first connection electrode CNE1 through a contact hole CNT-2 defined through the fourth insulating 40 and the fifth insulating layer 50. The sixth insulating layer 60 may be disposed on the fifth insulating layer 50. The first electrode AE is connected to the second connection electrode CNE2 through a contact hole CNT-3 defined through the sixth insulating layer 60.

In an embodiment, at least one of the first connection electrode CNE1 and the second connection electrode CNE2 may be omitted. Alternatively, an additional connection electrode for connecting a first light emitting element ED-R to the transistor T1 may be further included. The electrical connection method between the first light emitting element ED-R and the transistor T1 may be variously changed based on the number of insulating layers disposed between the first light emitting element ED-R and the transistor T1, but is limited to one embodiment.

The display device layer DP-ED may include a pixel defining layer PDL and the first light emitting element ED-R disposed in an opening OP defined in the pixel defining layer PDL.

The first light emitting element ED-R is disposed on the sixth insulating layer 60. In an embodiment, as illustrated in FIG. 3B, the first light emitting element ED-R may include a first electrode AE, a hole control layer HCL, a first light emitting layer EML-R, an electron control layer ECL, and a second electrode CE. However, the embodiment of the invention is not limited thereto, and in an alternative embodiment, the hole control layer HCL, the electron control layer ECL, and the second electrode CE may be provided to be pattern inside the opening OP defined in the pixel defining layer PDL. In an embodiment, at least one selected from the hole control layer HCL, the first light emitting layer EML-R, the electron control layer ECL, and the second electrode CE of the first light emitting element ED-R may be provided to be patterned through inkjet printing. The first electrode AE may be electrically connected to the transistor T1 through the first connection electrode CNE1 and the second connection electrode CNE2.

A first electrode AE is disposed on the sixth insulating layer 60. An opening OP is defined in the pixel defining layer PDL. The opening OP exposes at least a portion of the first electrode AE. The first emission area PXA-R may be defined to correspond to the first electrode AE exposed through the corresponding opening OP. The non-emission area NPXA may be adjacent to the first emission area PXA-R. The first emission area PXA-R may overlap the pixel defining layer PDL.

The hole control layer HCL may be commonly disposed on the first emission area PXA-R and the non-emission area NPXA. The hole control layer HCL may include a hole transport layer and may further include a hole injection layer. The first light emitting layer EML-R is disposed on the hole control layer HCL. The first light emitting layer EML-R may be disposed on an area corresponding to the opening OP.

An electronic control layer ECL is disposed on the first light emitting layer EML-R. The electron control layer ECL may include an electron transport layer and may further include an electron injection layer. The second electrode CE is disposed on the electron control layer ECL.

A lower protection layer PL1 may be disposed on the second electrode CE. The lower protection layer PL1 may prevent the second electrode CE from being damaged in a subsequent process, for example, a plasma process. The lower protection layer PL1 may include multiple layers or a single layer. In an embodiment, the lower protection layer PL1 may be an organic layer or an inorganic layer. In an embodiment, for example, where the lower protection layer PL1 includes an inorganic material, the lower protection layer PL1 may include an alkali metal compound, MgF2, or the like. In an embodiment, for example, where the lower protection layer PL1 may include the organic material, the organic material may include α-NPD, NPB, TPD, m-MTDATA, Alq3, CuPc, N4,N4,N4',N4'-tetra (biphenyl-4-yl) biphenyl-4,4'-diamine (TPD15), 4,4',4"-Tris(carbazol-9-yl) triphenylamine (TCTA), or the like, or may include an epoxy resin, or acrylic such as methacrylate. However, the embodiment is not limited thereto.

An upper protection layer PL2 may be disposed on the lower protection layer PL1. The upper protection layer PL2 may prevent the lower protection layer PL1 from being damaged by a subsequent chemical vapor deposition process of an inorganic material. The upper protection layer PL2 may be provided by a sputtering method, which is a physical vapor deposition method. In an embodiment, for example, the upper protection layer PL2 may include lithium fluoride (LiF).

An encapsulation layer TFE is disposed on the upper protection layer PL2. The encapsulation layer TFE may include a plurality of thin films. The encapsulation layer TFE will hereinafter be described in detail.

Figures 4, 5:
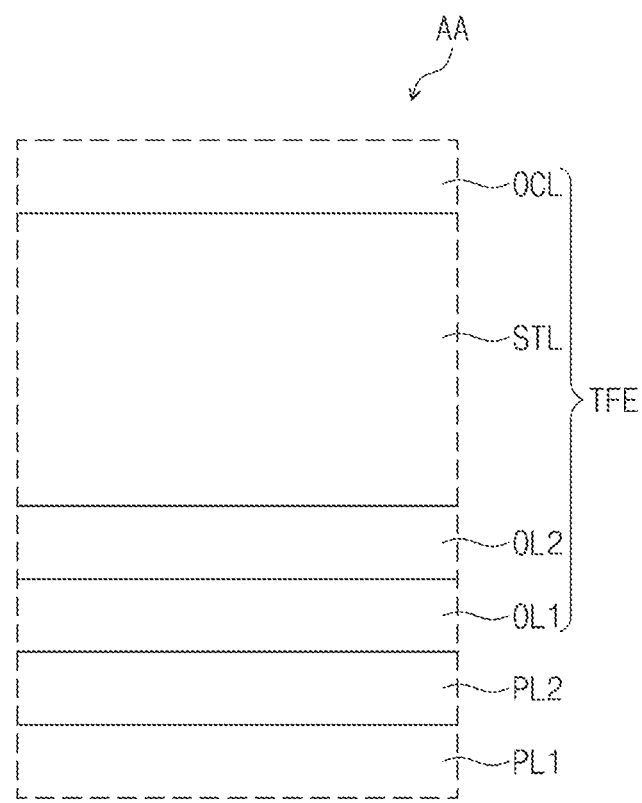
FIG. 4 is a cross-sectional view of an area AA according to an embodiment of the invention.
FIG. 5 is a table showing refractive indices according to a ratio of silicon atoms, nitrogen atoms, and oxygen atoms.

FIG. 4 is an enlarged cross-sectional view illustrating an area AA on a portion of the display panel according to an embodiment of the invention. FIG. 5 is a table showing refractive indices according to a ratio (e.g., an atomic ratio) of silicon atoms, nitrogen atoms, and oxygen atoms.

Referring to FIG. 4, the encapsulation layer TFE is disposed on the upper protection layer PL2. According to an embodiment of the invention, the encapsulation layer TFE may include a first optical layer OL1, a second optical layer OL2, a stabilization layer STL, and an optical control layer OCL.

An upper protection layer PL2 may be disposed on the lower protection layer PL1. According to an embodiment of the invention, a refractive index of the upper protection layer PL2 and a refractive index of the lower protection layer PL1 may be different from each other. In such an embodiment, the refractive index of the lower protection layer PL1 may be greater than the refractive index of the upper protection layer PL2. In an embodiment, for example, the refractive index of the lower protection layer PL1 may be about 1.6 or greater and about 2.3 or less.

The first optical layer OL1 may be disposed on the upper protection layer PL2. A thickness of the first optical layer OL1 may be greater than or equal to about 1,000 angstroms (Å) and less than or equal to about 2,000 Å. According to an embodiment of the invention, the thickness of the first optical layer OL1 may be greater than each of the thicknesses of the lower protection layer PL1 and the upper protection layer PL2. The first optical layer OL1 may be a layer that is improved in light emission efficiency by compensating for a resonance distance according to a wavelength of light emitted from the first light emitting layer EML-R (see FIG. 3B). The light emitted from the first light emitting layer EML-R may generate secondary resonance according to the thickness of the first optical layer OL1. In an embodiment, the thickness of the first optical layer OL1 has to be about 2,500 Å or less to allow the light emitted from the first light emitting layer EML-R to generate the secondary resonance. In an embodiment, for example, the thickness of the first optical layer OL1 may be about 1,300 Å. According to an embodiment of the invention, the refractive index of the first optical layer OL1 may be about 1.89 or greater and about 1.98 or less. In an embodiment, for example, the refractive index of the first optical layer OL1 may be about 1.89. In an embodiment of the invention, the refractive index of the first optical layer OL1 may be greater than the refractive index of the upper protection layer PL2.

The first optical layer OL1 may include or be made of a material including at least two selected from silicon atoms (Si), nitrogen atoms (N), and oxygen atoms (O). In an embodiment of the invention, the first optical layer OL1 may include or be made of a material including silicon atoms (Si) and nitrogen atoms (N). In an embodiment, for example, the first optical layer OL1 may include or be made of silicon nitride (SiNx). The first optical layer OL1 may include or be made of only silicon atoms (Si) and nitrogen atoms (N) and may not include oxygen atoms (O). As a result, the first optical layer OL1 may have a strong structure and protect the light emitting element from external moisture and foreign substances.

In FIG. 5, a refractive index according to a ratio of silicon atoms (Si), nitrogen atoms (N) and oxygen atoms (O) is illustrated. The table shown in FIG. 5 shows values obtained by calculating a refractive index according to a ratio of nitrogen atoms (N) and oxygen atoms (O) when a ratio of silicon atoms (Si) is converted to 1. For example, when the refractive index is about 1.48, a ratio of nitrogen atoms (N) and silicon atoms (Si) is about 1:4 (0.25:1), and a ratio of oxygen atoms (O) and silicon atoms (Si) is about 6:5 (1.2:1). Expressing the refractive index as a composition ratio, when the refractive index is about 1.48, silicon atoms (Si) may be contained at a composition ratio of about 410%, nitrogen atoms (N) may be contained at a composition ratio of about 10%, and oxygen atoms (O) may be contained at a composition ratio of about 49%.

According to an embodiment of the invention, the ratio of silicon atoms in the first optical layer OL1 may be about 57% or greater and about 59% or less, and the ratio of nitrogen atoms in the first optical layer OL1 may be about 41% or greater and about 43% or less. When the refractive index of the first optical layer OL1 is calculated based on the above-described composition ratio, a range of about 1.89 or greater and about 1.98 or less may be derived. That is, in an embodiment of the invention, the refractive index of the first optical layer OL1 may be about 1.89 or greater and about 1.98 or less.

Referring back to FIG. 4, the second optical layer OL2 may be disposed on the first optical layer OL1. A thickness of the second optical layer OL2 may be about 1,000 Å or greater and about 2,000 Å or less. According to an embodiment of the invention, the thickness of the second optical layer OL2 may be greater than each of the thicknesses of the lower protection layer PL1 and the upper protection layer PL2. The second optical layer OL2 may be a layer that is improved in light emission efficiency by compensating for a resonance distance according to a wavelength of light emitted from the first light emitting layer EML-R. The light emitted from the first light emitting layer EML-R may generate secondary resonance according to the thickness of each of the first optical layer OL1 and the second optical layer OL2. In an embodiment, the thickness of the second optical layer OL2 has to be about 2,500 Å or less to allow the light emitted from the first light emitting layer EML-R to generate the secondary resonance. In an embodiment, for example, the second optical layer OL2 may have a thickness of about 1,500 Å. According to one embodiment of the invention, the refractive index of the second optical layer OL2 may be about 1.34 or greater and about 1.48 or less. In an embodiment, for example, the refractive index of the second optical layer OL2 may be about 1.48. In an embodiment of the invention, the refractive index of the first optical layer OL1 may be greater than the refractive index of the second optical layer OL2.

According to an embodiment of the invention, the second optical layer OL2 may include or be made of a material including at least two selected from silicon atoms (Si), nitrogen atoms (N), and oxygen atoms (O). In an embodiment, for example, the second optical layer OL2 may include or be made of silicon nitride (SiON). In an embodiment, the ratio of silicon atoms in the second optical layer OL2 is about 40% or greater and about 41% or less, the ratio of nitrogen atoms in the second optical layer OL2 is about 7% or greater and about 10% or less, and the ratio of oxygen atoms in the second optical layer OL2 is about 49% or greater and about 53% or less. When the refractive index of the second optical layer OL2 is calculated based on the above-described composition ratio, a range of about 1.34 or greater and about 1.48 or less may be derived. That is, in an embodiment of the invention, the refractive index of the second optical layer OL2 may be about 1.34 or greater and about 1.48 or less.

The stabilization layer STL may be disposed on the second optical layer OL2. A thickness of the stabilization layer STL may be greater than the sum of the thicknesses of the first optical layer OL1 and the thickness of the second optical layer OL2. Specifically, the stabilization layer STL may have a thickness of about 7,000 Å or greater and about 9,000 Å or less. The stabilization layer STL serves to primarily protect the light emitting element from external moisture and foreign substances. According to an embodiment of the invention, the thickness of the stabilization layer STL may be about 7,000 Å or greater to protect the light emitting element from the external moisture and foreign substances. In an embodiment, for example, the stabilization layer STL may have a thickness of about 7,000 Å. According to an embodiment of the invention, the refractive index of the stabilization layer STL may be about 1.89 or greater and about 1.98 or less. In an embodiment, for example, the refractive index of the stabilization layer STL may be about 1.89. In an embodiment of the invention, the refractive index of the stabilization layer STL may be greater than the refractive index of the second optical layer OL2.

According to an embodiment of the invention, the stabilization layer STL may include or be made of a material including silicon atoms (Si) and nitrogen atoms (N). In an embodiment, for example, the stabilization layer STL may include or be made of silicon nitride (SiNx). The stabilization layer STL may include or be made of only silicon atoms (Si) and nitrogen atoms (N) and may not include oxygen atoms (O). As a result, the first optical layer OL1 may have a strong structure and protect the light emitting element from external moisture and foreign substances.

Referring to FIG. 5, in an embodiment, the ratio of silicon atoms in the stabilization layer STL may be about 57% or greater and about 59% or less, and the ratio of nitrogen atoms in the stabilization layer STL may be about 41% or greater and about 43% or less. When the refractive index of the stabilization layer STL is calculated based on the above-described composition ratio, a range of about 1.89 or greater and about 1.98 or less may be derived. That is, in an embodiment of the invention, the refractive index of the stabilization layer STL may be about 1.89 or greater and about 1.98 or less.

The optical control layer OCL may be disposed on the stabilization layer STL. A light output from the first light emitting layer EML-R (see FIG. 3B) may be reflected due to a difference between the refractive index of the stabilization layer STL and the refractive index of the film disposed on the optical control layer OCL. The optical control layer OCL may be a layer that prevent the light from not being output to the outside.

A thickness of the optical control layer OCL may be less than a thickness of each of the first optical layer OL1 and the second optical layer OL2. In an embodiment, for example, the optical control layer OCL may have a thickness of about 800 Å. Although not shown, a high-density oxygen layer may be disposed on the optical control layer OCL. According to an embodiment of the invention, the refractive index of the optical control layer OCL may be about 1.48 or greater and about 1.57 or less. In an embodiment, for example, the refractive index of the optical control layer OCL may be about 1.57. The refractive index of the optical control layer OCL is less than the refractive index of the stabilization layer STL. That is, the refractive index of the stabilization layer STL may be greater than the refractive index of each of the second optical layer OL2 and the optical control layer OCL.

The optical control layer OCL may include or be made of a material containing at least two of silicon atoms (Si), nitrogen atoms (N), and oxygen atoms (O). In an embodiment, for example, the optical control layer OCL may include or be made of silicon nitride (SiON). Referring to FIG. 5, in an embodiment, the ratio of silicon atoms in the optical control layer OCL is about 41% or greater and about 46% or less, the ratio of nitrogen atoms in the optical control layer OCL is about 10% or greater and about 19% or less, and the ratio of oxygen atoms in the optical control layer OCL is about 35% or greater and about 49% or less. When the refractive index of the optical control layer OCL is calculated based on the above-described composition ratio, a range of about 1.48 or greater and about 1.57 or less may be derived. That is, in an embodiment of the invention, the refractive index of the second optical layer OL2 may be about 1.48 or greater and about 1.57 or less.

Figure 6:
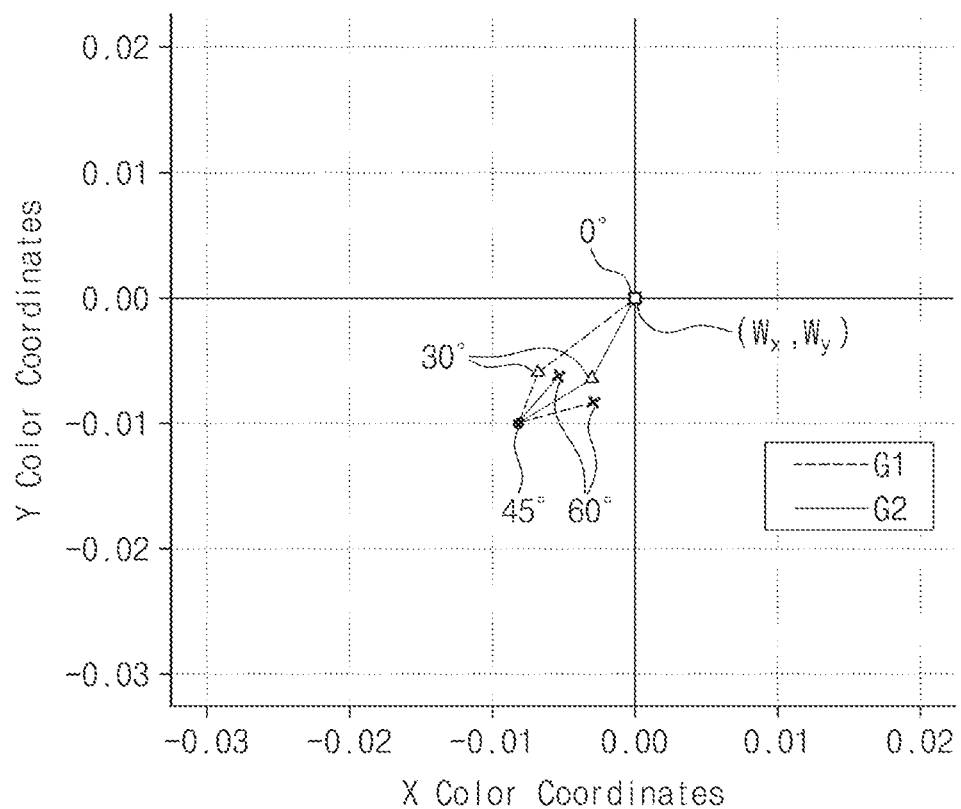
FIG. 6 is a graph showing a change in emission spectrum depending on a viewing angle according to a comparative example and an embodiment of the invention.

FIG. 6 is a graph showing a change in emission spectrum depending on a viewing angle according to a comparative example and an embodiment of the invention. The graphs described below are shown in a portion of the CIE 1976 color coordinates.

When the light emitted from the display device DD is viewed at different viewing angles, a phenomenon (hereinafter referred to as a white shift phenomenon) in which a white color is changed to another color may occur. The first graph G1 and the second graph G2 show spectrum of light emitted from the display device DD. Spectra of light with viewing angles of about 0° and about 45° were set as reference values. That is, the coordinate values of the CIE 1976 color coordinates may be fixed at points at which the viewing angles are about 0° and about 45°, and the coordinate values of the CIE 1976 color coordinates may be changed at points at which the viewing angles are about 30° and about 60°. The spectrum of light corresponding to the viewing angle of about 0° is indicated by color coordinates (Wx,Wy).

The first graph G1 shows a spectrum of light emitted from a comparative example of the display device where the stabilization layer having a low refractive index is provided on a single optical layer. According to the first graph G1, the points at which the viewing angles are about 300 and about 600 may be disposed away from a straight line connecting the points at which the viewing angles are about 0° and about 450 in the CIE 1976 color coordinates.

The second graph G2 shows a spectrum of light emitted from the display device DD according to an embodiment of the invention. In such an embodiment, as illustrated in FIG. 4, the encapsulation layer TFE may include a first optical layer OL1, a second optical layer OL2, a stabilization layer STL, and an optical control layer OCL. The stabilization layer STL may have a high refractive index of about 1.89 and a thickness of about 7,000 Å. According to the second graph G2, the point at which the viewing angle is about 30° may be disposed below a right side rather than the point at which the viewing angle in the first graph G1 is about 30° in the CIE 1976 color coordinates. The point at which the viewing angle is about 60° may be disposed at a left upper end rather than the point at which the viewing angle in the first graph G1 is about 60° in the CIE 1976 color coordinates. Thus, the points at which the viewing angles of about 30° and about 60° in the second graph G2 may be disposed close to a straight line connecting the points at which the viewing angles are about 0° and about 45°.

When compared to the comparative example, in the display device DD according to an embodiment of the invention, the points at which the viewing angles in the second graph G2 are about 30° and about 60° may be disposed closer to a straight line connecting the points at which the viewing angles are about 0° and about 45° rather than the point at which the viewing angles in the first graph G1 are about 30° and about 60°. Thus, the display device DD according to an embodiment includes the first optical layer OL1 and the second optical layer OL2, which have different refractive indices, such that the white shift phenomenon may not appear on the basis of the viewing angles of about 0° and about 450 even when the viewing angle is changed. Accordingly, the display device DD having improved display quality may be provided to the user.

Figure 7:
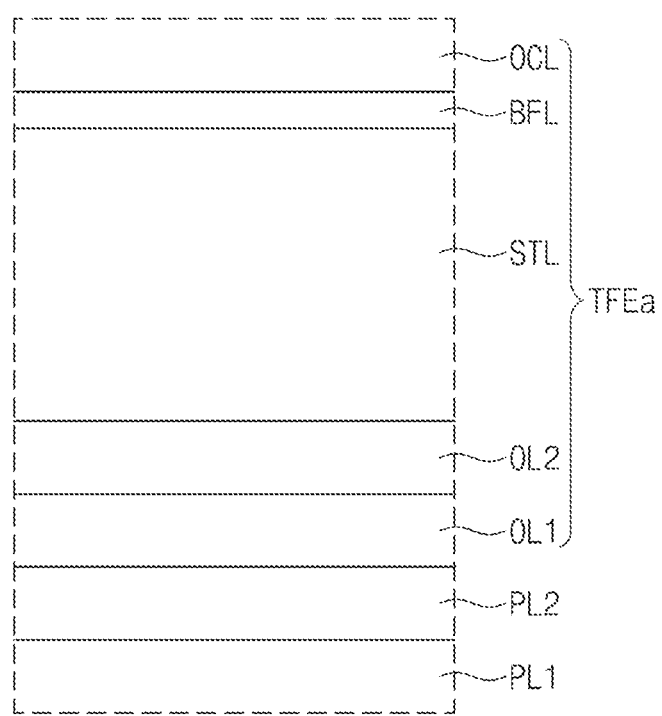
FIG. 7 is a cross-sectional view illustrating a portion of the display panel according to an embodiment of the invention.

FIG. 7 is a cross-sectional view illustrating a portion of the display panel according to an embodiment of the invention.

Referring to FIG. 7, the encapsulation layer TFEa according to an embodiment of the invention may include a first optical layer OL1, a second optical layer OL2, a stabilization layer STL, a buffer layer BFL, and an optical control layer OCL. In such an embodiment, the buffer layer BFL may be further disposed between the stabilization layer STL and the optical control layer OCL.

A refractive index of the buffer layer BFL is greater than the refractive index of the optical control layer OCL and less than the refractive index of the stabilization layer STL. According to an embodiment of the invention, the refractive index of the buffer layer BFL may be about 1.62 or greater and about 1.77 or less. In an embodiment, for example, the refractive index of the buffer layer BFL may be about 1.62. If a difference in refractive index of different layers is large, total reflection of light may occur at an interface between the layers. The refractive index of the buffer layer BFL may have a value between the refractive index of the optical control layer OCL and the refractive index of the stabilization layer STL. As a result, light totally reflected at the interface of the optical control layer OCL may be reduced.

The buffer layer BFL may include or be made of a material containing at least two of silicon atoms (Si), nitrogen atoms (N), and oxygen atoms (O). In an embodiment, for example, the buffer layer BFL may include or be made of silicon nitride (SiON). Referring to FIG. 5, in an embodiment, the ratio of silicon atoms in the buffer layer BFL is about 46% or greater and about 52% or less, the ratio of nitrogen atoms in the buffer layer BFL is about 22% or greater and about 34% or less, and the ratio of oxygen atoms in the buffer layer BFL is about 14% or greater and about 32% or less. When the refractive index of the optical control layer OCL is calculated based on the above-described composition ratio, a range of about 1.62 or greater and about 1.77 or less may be derived. That is, in an embodiment of the invention, the refractive index of the second optical layer OL2 may be about 1.62 or greater and about 1.77 or less.

Figure 8:
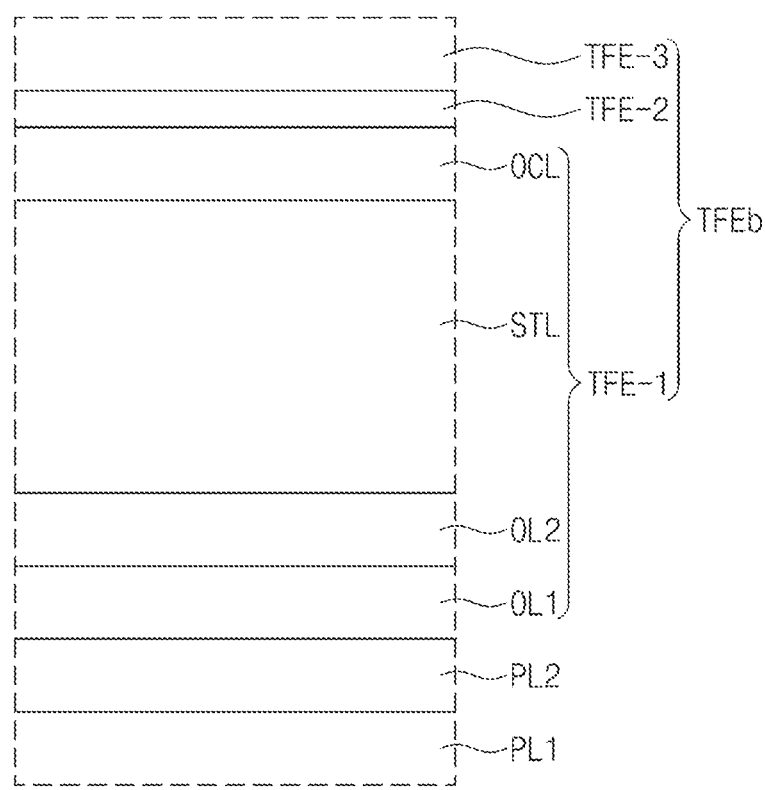
FIG. 8 is a cross-sectional view illustrating a portion of the display panel according to an embodiment of the invention.

FIG. 8 is a cross-sectional view illustrating a portion of the display panel according to an embodiment of the invention.

Referring to FIG. 8, an encapsulation layer TFEb according to an embodiment of the invention includes a first encapsulation layer TFE-1, a second encapsulation layer TFE-2, and a third encapsulation layer TFE-3. The first encapsulation layer TFE-1 is disposed on an upper protection layer PL2. The first encapsulation layer TFE-1 may include a first optical layer OL1, a second optical layer OL2, a stabilization layer STL, and an optical control layer OCL. The encapsulation layer TFE illustrated in FIG. 4 may have the same configuration as the first encapsulation layer TFE-1 illustrated in FIG. 8. Thus, any repetitive detailed description of the structure of the first encapsulation layer TFE-1 will be omitted.

The second encapsulation layer TFE-2 may be disposed on the first encapsulation layer TFE-1. According to an embodiment of the invention, the second encapsulation layer TFE-2 may be an organic layer including an organic material. The second encapsulation layer TFE-2 may provide a flat surface on the first encapsulation layer TFE-1. The curved portion of a top surface of the first encapsulation layer TFE-1 or particles existing on the first encapsulation layer TFE-1 may be covered by the second encapsulation layer TFE-2 to prevent a surface state of the top surface of the first encapsulation layer TFE-2 from having an influence on components disposed on the second encapsulation layer TFE-2. The second encapsulation layer TFE-2 may include an organic material and be formed through a solution process such as spin coating, slit coating, inkjet process, or the like. A refractive index of the second encapsulation layer TFE-2 may be less than the refractive index of the optical control layer OCL.

A third encapsulation layer TFE-3 may be disposed on the second encapsulation layer TFE-2. According to one embodiment of the invention, a thickness of the stabilization layer STL may be about twice a thickness of the third encapsulation layer TFE-3. In an embodiment, for example, the stabilization layer STL may have a thickness of about 7,000 Å or greater and about 9,000 Å or less, and the third encapsulation layer may have a thickness of about 3,000 Å or greater and about 4,000 Å or less. A refractive index of the third encapsulation layer TFE-3 may be greater than a refractive index of the second encapsulation layer TFE-2.

The third encapsulation layer TFE-3 is disposed on the second encapsulation layer TFE-2 to cover the second encapsulation layer TFE-2. The third encapsulation layer TFE-3 may be stably disposed on a relatively flat surface than that disposed on the first encapsulation layer TFE-1. The third encapsulation layer TFE-3 may encapsulate moisture discharged from the second encapsulation layer TFE-2 to prevent the moisture from being introduced to the outside. The third encapsulation layer TFE-3 may include silicon nitride, silicon oxide, or a combination thereof. The third encapsulation layer TFE-3 may be formed through a deposition process.

According to embodiments of the invention, the encapsulation layer may include the thick stabilization layer including or made of the material including silicon and nitrogen to effectively protect the light emitting element from the external moisture and the foreign substances.

According to embodiments of the invention, the encapsulation layer may include the plurality of optical layers having the different refractive indices from each other to prevent the white shift phenomenon from occurring when the light emitted from the light emitting element passes through the encapsulation layer.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a base layer;
    a pixel defining layer disposed on the base layer, wherein an opening is defined in the pixel defining layer;
    a light emitting element comprising a light emitting layer disposed in the opening; and
    an encapsulation layer disposed on the light emitting element,
    wherein the encapsulation layer comprises:
        a first optical layer;
        a second optical layer disposed on the first optical layer;
        a stabilization layer disposed on the second optical layer; and
        an optical control layer disposed on the stabilization layer,
        wherein a refractive index of the first optical layer is greater than a refractive index of the second optical layer, and a refractive index of the stabilization layer is greater than each of the refractive index of the second optical layer and a refractive index of the optical control layer,
        the stabilization layer comprises silicon atoms and nitrogen atoms, and
        a thickness of the stabilization layer is greater than each of a thickness of the first optical layer and a thickness of the second optical layer.

2. The display device of claim 1, wherein the thickness of the stabilization layer is greater than a sum of the thickness of the first optical layer and the thickness of the second optical layer.

3. The display device of claim 2, wherein the thickness of the stabilization layer is about 7,000 Å or greater and about 9,000 Å or less.

4. The display device of claim 1, wherein
    a ratio of the silicon atoms in the stabilization layer is about 57% or greater and about 59% or less, and
    a ratio of the nitrogen atoms in the stabilization layer is about 41% or greater and about 43% or less.

5. The display device of claim 1, wherein the refractive index of the stabilization layer is about 1.89 or greater and about 1.98 or less.

6. The display device of claim 1, wherein each of the thickness of the first optical layer and the thickness of the second optical layer is about 1,000 Å or greater and about 2,000 Å or less.

7. The display device of claim 1, wherein each of the first optical layer and the second optical layer comprises at least two selected from silicon atoms, nitrogen atoms, and oxygen atoms.

8. The display device of claim 7, wherein
    the first optical layer comprises silicon atoms and nitrogen atoms,
    a ratio of the silicon atoms in the first optical layer is about 57% or greater and about 59% or less, and
    a ratio of the nitrogen atoms in the first optical layer is about 41% or greater and about 43% or less.

9. The display device of claim 7, wherein
    a ratio of the silicon atoms in the second optical layer is about 40% or greater and about 41% or less,
    a ratio of the nitrogen atoms in the second optical layer is about 7% or greater and about 10% or less, and
    a ratio of oxygen atoms in the second optical layer is about 49% or greater and about 53% or less.

10. The display device of claim 1, wherein the refractive index of the first optical layer is about 1.89 or greater and about 1.98 or less.

11. The display device of claim 1, wherein the refractive index of the second optical layer is about 1.34 or greater and about 1.48 or less.

12. The display device of claim 1, further comprising:
    a lower protection layer disposed on the light emitting element; and
    an upper protection layer disposed on the lower protection layer,
    wherein each of a refractive index of the lower protection layer and the refractive index of the first optical layer is greater than a refractive index of the upper protection layer.

13. The display device of claim 1, wherein
    the encapsulation layer further comprises a buffer layer disposed between the stabilization layer and the optical control layer, and
    a refractive index of the buffer layer is greater than the refractive index of the optical control layer and less than the refractive index of the stabilization layer.

14. The display device of claim 13, wherein each of the buffer layer and the optical control layer comprises at least two selected from silicon atoms, nitrogen atoms, and oxygen atoms.

15. The display device of claim 14, wherein
    a ratio of the silicon atoms in the buffer layer is about 46% or greater and about 52% or less,
    a ratio of the nitrogen atoms in the buffer layer is about 22% or greater and about 34% or less, and
    a ratio of the oxygen atoms in the buffer layer is about 14% or greater and about 32% or less.

16. The display device of claim 14, wherein
    a ratio of the silicon atoms in the optical control layer is about 41% or greater and about 46% or less,
    a ratio of the nitrogen atoms in the optical control layer is about 10% or greater and about 19% or less, and
    a ratio of the oxygen atoms in the optical control layer is about 35% or greater and about 49% or less.

17. The display device of claim 13, wherein the refractive index of the buffer layer is about 1.62 or greater and about 1.77 or less.

18. The display device of claim 13, wherein the refractive index of the optical control layer is about 1.48 or greater and about 1.57 or less.

19. The display device of claim 1, further comprising:
    a first encapsulation layer;
    a second encapsulation layer disposed on the first encapsulation layer; and
    a third encapsulation layer disposed on the second encapsulation layer,
    wherein the first encapsulation layer comprises the encapsulation layer.

20. The display device of claim 19, wherein a thickness of the third encapsulation layer is about 3,000 Å or greater to about 4,000 Å or less.

* * * * *